United States Patent [19]
Lin et al.

[11] Patent Number: 5,446,416
[45] Date of Patent: Aug. 29, 1995

[54] TIME ACQUISITION SYSTEM WITH DUAL-LOOP FOR INDEPENDENT FREQUENCY PHASE LOCK

[75] Inventors: Jizoo Lin, Taipei Hsien; Hsan-Fong Lin, Yun-Lin Hsien; Ret-Bean Lee, Pintong Hsien; Chorng-Kuang Wang, Taipei, all of

[73] Assignee: Industrial Technology Research Institute, Hsinchu,

[21] Appl. No.: 139,548

[22] Filed: Oct. 20, 1993

[51] Int. Cl.[6] .............................................. H03L 7/06
[52] U.S. Cl. .......................................... 331/11; 331/2
[58] Field of Search ................ 331/2, 10, 11, 12, 25; 455/182.2, 192.2, 265; 375/120; 329/325

[56] References Cited

U.S. PATENT DOCUMENTS 4,131,861  12/1978  Malaviya ............................... 331/2

OTHER PUBLICATIONS

Cordell et al., A 50 MHz Phase-and Frequeny-Locked Loop, Dec. 1979, pp. 1003–1005.

Primary Examiner—Robert J. Pascal
Assistant Examiner—David Vu
Attorney, Agent, or Firm—Bo-In Lin

[57] ABSTRACT

A time acquisition system is disclosed with dual independent frequency and phase lock loops, each containing a dedicated voltage controlled oscillator (VCO). The frequency lock loop (FLL) outputs a frequency bias signal, used for coarse frequency lock-up, only when the difference frequency between the input signal and the FLL VCO is outside a predetermined frequency band $-\Delta\omega_L$ to $\Delta\omega_L$. Significantly, the frequency bias signal is equal to zero when the difference frequency between the input signal and the FLL VCO is inside the frequency band $-\Delta\omega_L$ to $\Delta\omega_L$. The phase lock loop (PLL) provides a phase bias signal, used for fine tuning lock-up, when the difference frequency between the input signal and the PLL VCO is inside the predetermined frequency band $-\Delta\omega_L$ to $\Delta\omega_L$. Therefore, there is no interaction between loops during the final phase tuning lock-up.

15 Claims, 8 Drawing Sheets

TIME ACQUISITION SYSTEM WITH DUAL-LOOP FOR INDEPENDENT FREQUENCY PHASE LOCK

BACKGROUND OF THE INVENTION

1. Field of the Invention

This invention relates generally to the system architecture and method for a time recovery system. More particularly, this invention relates to a system architecture to achieve a fast time acquisition by utilizing independent dual-loop with frequency and phase locking operations capable of performing a continuous automatic frequency trimming.

2. Description of the Prior Art

As greater amounts of data and signals are now being transmitted among the networked systems, application of conventional time-acquisition techniques in such networked systems often becomes a bottleneck in the operation of high speed communication due to the elapsed-time required in performing the task of time-recovery. Another difficulty often encountered in such communication systems by the use of the conventional time-acquisition system is the frequency instability. When there is a frequency drift either for the transmitting or the receiving system, mismatches or errors in communication may occur. Such difficulties are becoming even more serious when the frequency, i.e., the data rate, is rapidly increasing as the modern communication and computer technology push the communication systems to achieve unprecedented high speed.

In order to perform the task of time acquisition, or sometimes referred to as 'time synthesis', the system clock of the receiving system must be synthesized with the incoming signals. The signal receiving system must be able to detect the frequency and the phase of the incoming signals and performs a frequency and phase synthesis in order to accurately capture the incoming signals. The task of 'time synthesis' becomes quite complicated because there is a close interdependency between the detection and locking of the receiving system's frequency and phase to that of the incoming signals. When there is an error in detecting or locking to either the frequency or phase, a corresponding error is generated which could soon leads to signal divergence and frequency or phase instabilities which often hinder a receiving system from accurately capturing the incoming signals.

Several types of time recovery systems are commonly applied in the prior art to achieve this frequency and phase synthesis task. The first type is the inter-dependent continuous dual frequency locking loop (FLL) and phase locking loop (PLL) system. A basic architecture of an inter-dependent dual FLL/PLL system 10 is shown in FIG. 1. The incoming input signals 15 are received simultaneously by a phase detector 20 and a frequency detector 25. The detected signals are then processed by a PLL loop filter 30 and a FLL loop filter 35. The results generated from these filters are then processed by a summing operating means 40 to generate an inter-loop error signal for inputting to a voltage controlled oscillator 45 to generate an output signal 50.

AT&T's T7035 Clock Recovery Circuit represents such a system (Data Sheet, Microelectronics AT&T, July 1991). It operates over a frequency range of 51.5 to 235 MHz using a single plus or minus five volts supply. The overall circuit architecture includes a phase and frequency locked loop to extract the clock from the input data. The basic operation is managed by a low-gain PLL composed of a phase detector, a variable length current controlled oscillator (CCO), and a frequency divider circuit. Such a system has a difficulty caused by the dual loop interferences due to the inter-dependencies and coupling of loop operations. Because of the complicate inter-dependencies of loop parameters between these two loops, the inter-loop interferences often make the optimization of loop parameters difficult to achieve. Additionally, due to the inter-loop interferences, the time required for either of the loops to accurately lock on to the input signal is increased which causes the slowdown of the acquisition time.

A second type of time recovery system is a digital-frequency-trim with PLL system. FIG. 2 shows in block diagram a basic system architecture of this type of systems wherein a digital-frequency-trim with PLL system 60 has a phase detector 65 to receive the input signal 62. The detected signal is then processed by a loop filter 70 on the phase lock loop (PLL). The system 60 also includes a reference clock 75 which generates a reference clock signal to a frequency detector 80. The detected frequency is controlled by a digital control logic 85. The results generated by the digital control logic 85 and the PLL loop filter 70 are then processed by a summing operation means 90 to generate an error signal to adjust a voltage control oscillator (VCO) to generate an output signal 100.

Caldwell et al. disclose such a time acquisition system in U.S. Pat. No. 4,580,107, entitled 'Phase Lock Acquisition System having FLL for Coarse Tuning and PLL for Fine Tuning' (issued on Apr. 1, 1986). Caldwell et al. applied a system architecture which is capable of acquiring phase lock from incoming signals which may have large frequency errors. A combination of analog and digital circuits are used wherein the phase locked loop is used as a tracking filter. The filter employs a wideband frequency discriminator and digital positioning circuit to acquire phase lock. A digital control is used in the FLL to tune the VCO within acquisition range of the wide-band frequency discriminator. The frequency is trimmed into the PLL capture range before the timing recovery system operates and the whole communication system using this time recovery system has to be on hold during this frequency trimming process.

This type of architecture requires a reference clock and the associated frequency trimming circuits. A crystal is usually used as a reference clock for trimming purposes and a digital to analog converter (DAC) is usually implemented in configuring the trimming circuit. It should be noted that the least significant bit for the DAC corresponding to the frequency resolution has to be at least smaller than the pull-in range of the system. This requirement increases the complexity of the DAC's design, especially when the DAC design is to be implemented by a very large scale integrated (VLSI) circuit for a high speed communication system.

Because of the above design considerations, this type of time recovery system requires not only an external clock to provide a reference clock signal, but the design and fabrication of such systems are more complex and generally would occupy larger volume. This type of system also has a disadvantage in that the tuning is limited by the discrete resolution of the frequency trimming circuits. Additionally, since the PLL and the frequency trimming loop are coupled, the loop parameters are highly inter-dependent due to the coupling of the summing operation means 90, and the difficulties of inter-loop interferences as encountered by the previous dual loop system also limit the speed and optimization of this type of time recovery system.

A third type of time acquisition system is similar to the digital trim PLL system described above except that instead of using a single VCO, this type of timing synthesis circuits uses two VCOs. Malaviya discloses in U.S. Pat. No. 4,131,861, entitled 'Variable Frequency Oscillator System Including Two Matched Oscillators Controlled by a Phase Locked Loop', (Issued on Dec. 26, 1978) a variable frequency oscillator for providing a frequency output which is near the output of a highly stable crystal oscillator. The output of the crystal oscillator and the output of one of the variable frequency oscillators are provided to a phase locked loop which in turn provides a correctional signal to both variable frequency oscillators. This causes the first VCO to lock in with the reference frequency so that its output frequency becomes identical with the reference frequency. This further causes the second VCO to have an output frequency that is highly stable about the center reference frequency of the crystal oscillator. The output of the second VCO can be used as the system clock for the local system. In addition to the same difficulties caused by the dual loop interferences and discrete tuning as mentioned above, this type of systems also requires an external reference clock.

This basic technique is used by Thompson and Lee as described in their paper entitled 'A BiCOMS Receiver/Transmit PLL Pair for Serial Data Communication' (IEEE 1992, Custom Integrated Circuit Conference) the phase locked loops for frequency synthesis and clock recovery in serial data communication. A master-slave loop architecture is constructed which uses the frequency reference for the transmit loop to set the center frequency of the receive loop. The transmit frequency synthesis loop serves as the master loop which comprises a first VCO, a phase-frequency detector, pre-scaler, and loop filter to generate the transmit dock from an external reference clock. The receive loop is set up as the slave loop which comprises a second VCO, a phase detector, and a loop filter. The receive loop uses the transmit loop control voltage as a coarse adjustment to its input to the second VCO. This assures the central frequency of the receive loop is within the VCO mismatch of the input data rate.

Even though this technique generates a highly stable output frequency that is very close to the central frequency of the reference clock signal, this type of architecture suffers the disadvantage that it requires an external clock. The additional hardware requirements add more complexities to the IC design and fabrication. The total volume of the signal processing device is also increased due to additional hardware requirements. Furthermore, the same limitations on acquisition speed imposed by the inter-loop interferences cannot not be resolved by this type of time-recovery system.

Therefore, there is still a need in the art in the design and fabrication of time recovery systems to have a novel and improved system architecture and signal processing techniques that would resolve the difficulties and remove the limitations described above. Namely, this system must be able to reduce and minimize the inter-loop interferences to improve the acquisition while maintaining a simple system architecture without unduly imposing extra complexities on the system design and hardware requirements.

SUMMARY OF THE PRESENT INVENTION

It is therefore an object of the present invention to provide a novel and improved architecture for time recovery systems to overcome the difficulties of the prior art.

Specifically, it is an object of the present invention to provide a time recovery system with independent frequency and phase locking loops such that the interferences between these loops may be minimized.

Another object of the present invention is to provide a time recovery system with improved acquisition time such that the time recovery system would be more suitable for high bandwidth communication system applications.

Another object of the present invention is to provide a time recovery system without requiring an external clock such that the hardware requirement may be reduced and the IC integratability may be improved.

Another object of the present invention is to provide a time recovery system which would allow continuous tuning in either frequency or phase loop such that the difficulties encountered in discrete tuning may be eliminated.

Another object of the present invention is to provide a time recovery system wherein the frequency loop has an automatic and continuous trimming capability to accurately follow the receive incoming signals.

Briefly, in a preferred embodiment, the present invention comprises a time acquisition system which receives a plurality of input signals with an input frequency and an input phase. The time acquisition system includes a frequency lock loop (FLL) which includes a frequency delimiter, a FLL loop filter, and a FLL voltage controlled oscillator (VCO), wherein the frequency delimiter processes the input signals utilizing the FLL VCO input as reference for generating a delimited frequency bias signal for inputting to the FLL loop filter for integrating into a frequency bias signal. The FLL VCO receives the frequency bias signal from the FLL loop filter for adjusting its frequency for minimizing the frequency bias and locking to the input frequency. The time acquisition system further includes a phase lock loop (PLL) which includes a phase detector, a PLL loop filter, a summing means, and a PLL voltage controlled oscillator. The phase detector detects the phase of the input signals utilizing a PLL VCO input from the PLL VCO as a frequency reference for generating a phase signal. The PLL loop filter processes the phase signal for generating a phase bias signal. The summing means receives and processes the phase bias signal and the frequency bias signal for generating a PLL VCO bias input for inputting to the PLL VCO which then generates an output signal for minimizing the frequency bias and the phase bias and for locking to the input phase. The frequency delimiter further includes a bandpass filtering means which in combination with the FLL loop filter can generate error signals of large amplitudes for the FLL VCO for effective coarse frequency tuning when the difference between the FLL VCO reference frequency and the input frequency is outside of a frequency band. In contrast, the error signal amplitude is reduced to zero when the difference between the FLL VCO reference frequency and the input frequency is within a frequency band such that the interference between the FLL loop and the PLL loop is eliminated.

It is an advantage of the present invention that it provides a time recovery system with independent frequency and phase locking loops such that the interferences between these loops may be eliminated.

Another advantage of the present invention is that it provides a time recovery system with improved acquisition time such that the time recovery system would be more suitable for high bandwidth communication system applications.

Another advantage of the present invention is that it provides a time recovery system without requiring an external clock such that the hardware requirement may be reduced and the IC integratability may be improved.

Another advantage of the present invention is that it provides a time recovery system which would allow continuous tuning in either frequency or phase loop such that the difficulties encountered in discrete tuning may be eliminated.

Another advantage of the present invention is that it provides a time recovery system wherein the frequency loop has an automatic and continuous trimming capability to accurately follow the receive incoming signals.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
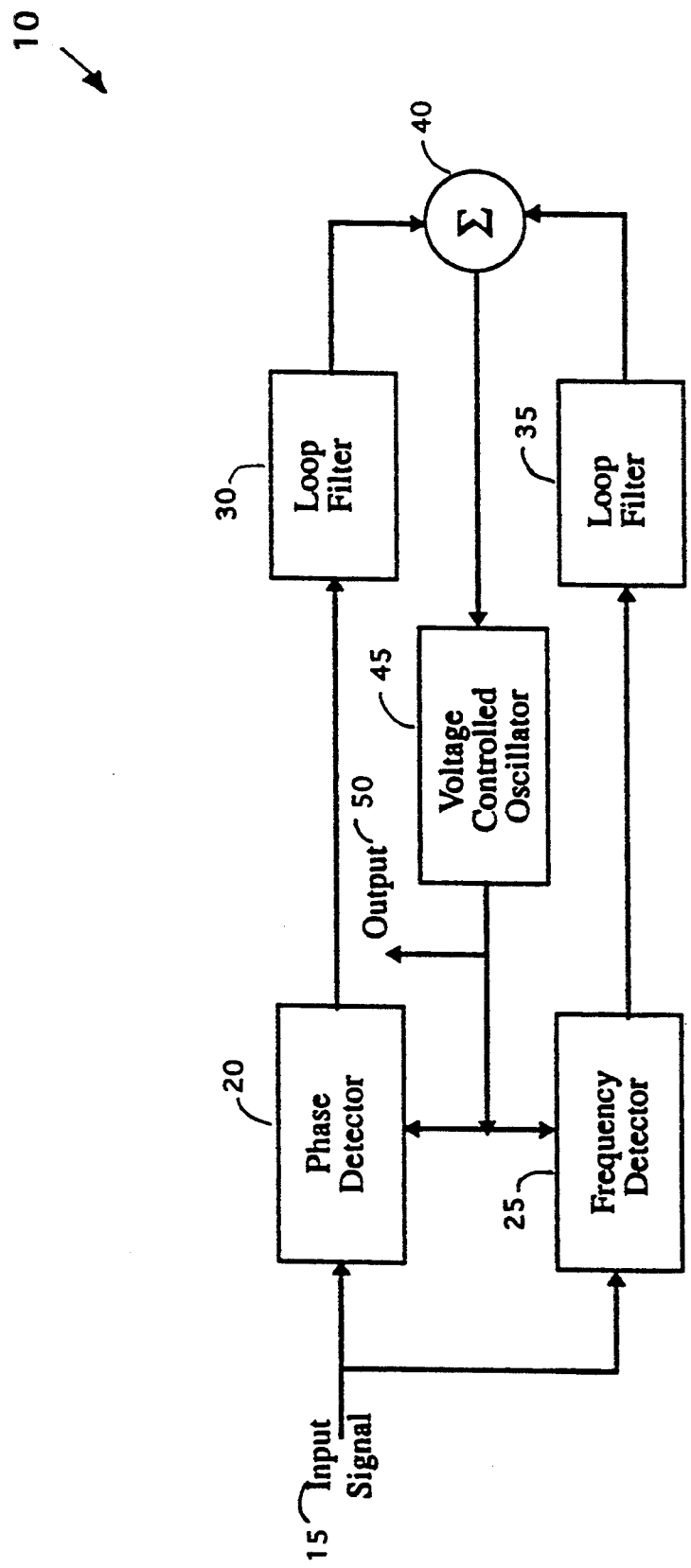
FIG. 1 is a block diagram showing a prior art interdependent FLL-PLL dual loop time recovery system.
Figure 2:
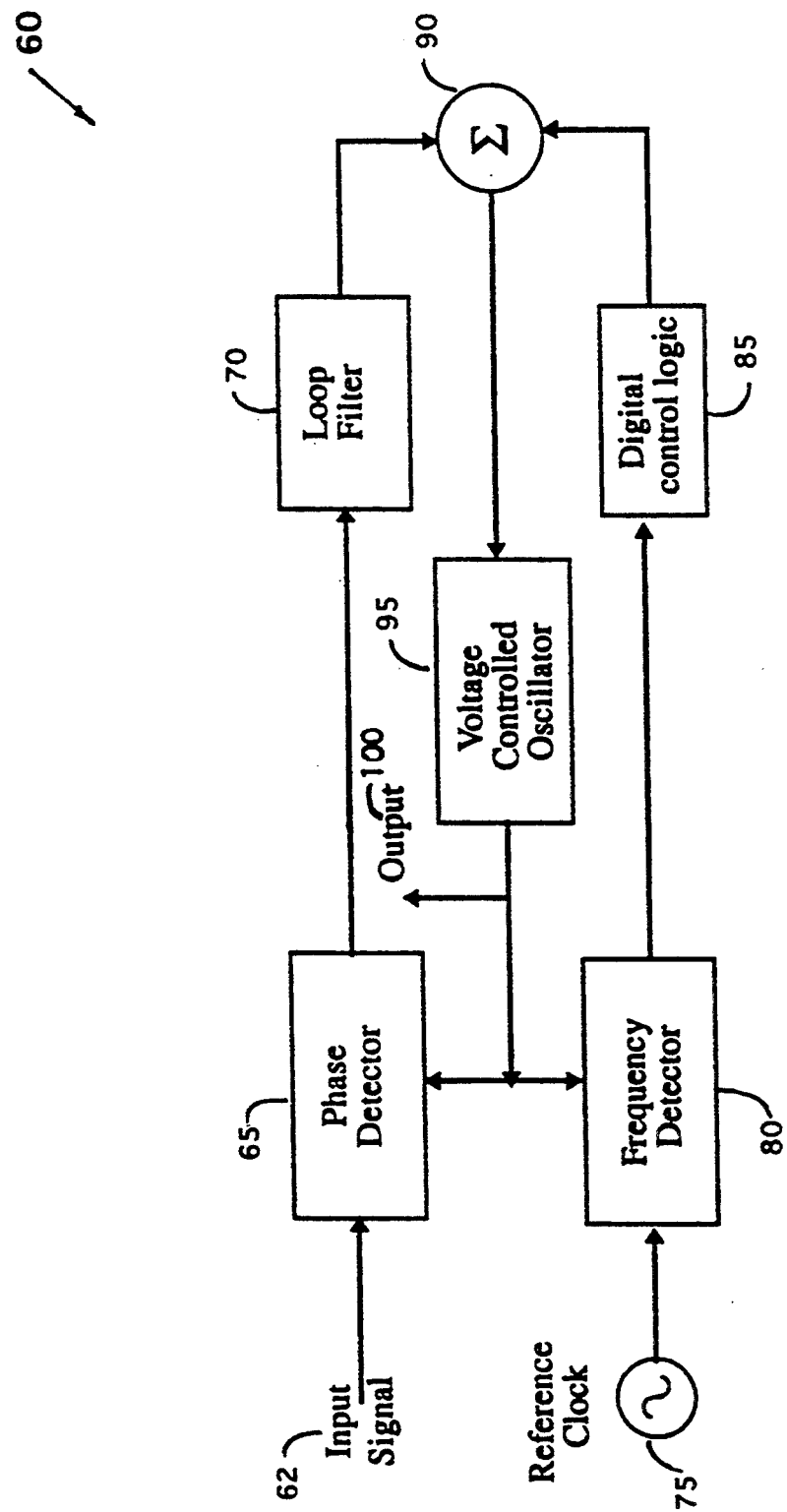
FIG. 2 is a block diagram showing a prior art interdependent digital frequency trim and PLL with single VCO dual loop time recovery system.
Figure 3:
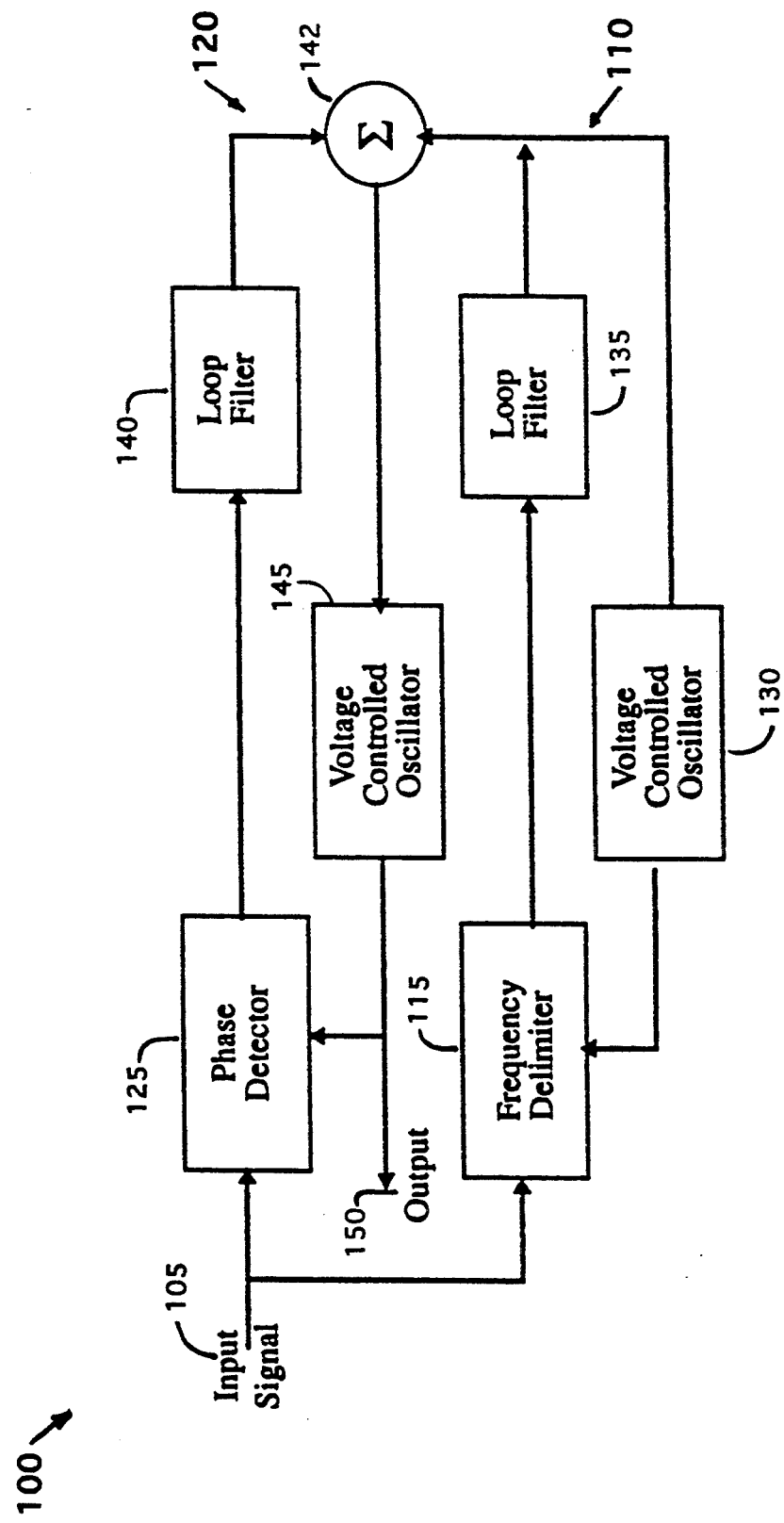
FIG. 3 is a block diagram showing an independent FLL-PLL dual loop time recovery system of the present invention.

FIG. 3 is a block diagram which shows a time recovery system 100 which receives the input signal from the communication transmitting line 105. The input signals are received and processed by two independent loops, i.e., the frequency loop 110 and the phase loop 120. The input signals are first detected by a frequency delimiter 115 on the frequency loop 110 and by the phase detector 125 on the phase loop 120. The frequency delimiter 115 also receives a feedback input from a first VCO 130 and then generates an output signal which is then transmitted to a loop filter 135 to be further processed before it is received by the phase loop 120 and meanwhile it is also looped back through the first VCO 130 to the frequency delimiter 125. The function of the loop filter 135 is essentially to perform an integration over the range of frequency deviation to generate a voltage difference output to the VCO for frequency bias correction and to generate a PLL pull-in voltage for inputting to the PLL loop 120.

In the phase loop 120, in parallel with the processes performed in the frequency loop 110, the input signal after being detected by the phase detector 125 is transmitted to a phase loop filter 140 which performs an integration over a range of phase bias to generate a voltage input to the VCO 145 for correcting the phase bias. After the phase loop filter 140 further processes on the signal received from the phase detector 125, it is summed with the signal generated by the frequency loop 110 before it is received by the output VCO 145 to generate the output signal on the output line 150, meanwhile, the output generated by the output VCO 145 is also looped back through the phase detector 125 as feedback signal on the phase loop 120.

By the use of the frequency delimiter 115 in combination with the loop filter 135, the PLL loop 120 operates almost entirely independent from the interferences of the FLL 110. As will become clear after the details of the functions performed by the frequency delimiter 110 are described below, the pull-in range FLL 110 is only used to perform very coarse frequency tuning initially. Once the frequency falls within a pre-defined range, the fine tuning is essentially performed by the PLL since the output of the FLL for inputting to PLL is mostly negligible in that range.

The present invention thus discloses a time acquisition system 100 which receives a plurality of input signals 105 with an input frequency and an input phase. The time acquisition system 100 includes a frequency lock loop (FLL) 110 which includes a frequency delimiter 105, a FLL loop filter 130, and a FLL voltage controlled oscillator (VCO) 130, wherein the frequency delimiter 115 processes the input signals utilizing a FLL VCO 130 input as reference for generating a delimited bias signal for inputting to the FLL loop filter 135 for integrating into a frequency bias signal. The FLL VCO 130 receives the frequency bias signal from the FLL loop filter 135 for adjusting its frequency for minimizing the frequency bias and locking to the input frequency. The time acquisition system further includes a phase lock loop (PLL) 120 which includes a phase detector 125, a PLL loop filter 140, a summing means 142, and a PLL voltage controlled oscillator 145. The phase detector 125 detects the phase of the input signal utilizing a PLL VCO 145 input from the PLL VCO 145 as a frequency reference for generating a phase signal. The PLL loop filter 140 processes the phase signal for generating a phase bias signal. The summing means 142 receives and processes the phase bias signal and the frequency bias signal for generating a PLL VCO bias input for inputting to the PLL VCO 145 which then generates an output signal for minimizing the frequency bias and the phase bias and for locking to the input phase. The frequency delimiter 115 further includes a bandpass filtering means, i.e., 170 and 175 to be described below, which in combination with the FLL loop filter 135 further can generate error signals of large amplitudes for the FLL VCO 130 for effective coarse frequency tuning when the difference between the FLL VCO 130 reference frequency and the input frequency is outside of a frequency band while the amplitude is reduced to zero when the difference between the FLL VCO 130 reference frequency and the input frequency is within a frequency band such that the interference between the FLL loop 110 and the PLL loop 120 is eliminated.

The present invention also discloses a method for synchronizing a system to the frequency and phase of a plurality of input signals. The method comprises the steps :(a) utilizing a frequency lock loop (FLL) which includes a FLL VCO and a delimited frequency generating means. The delimited frequency bias generating means receives a FLL VCO frequency and the frequency of the input signals for generating a delimited bias voltage capable of coarse tuning the voltage of the FLL VCO when the difference between the input frequency and the FLL VCO frequency is outside of a predetermined frequency band. The delimited bias voltage is reduced to zero when the frequency difference is within the frequency band. The method further includes a step (b) utilizing a phase lock loop (PLL) which includes a PLL VCO for generating a PLL loop frequency, and phase detector for receiving and detecting the phase of the input signals and for generating a phase bias signal utilizing the PLL loop frequency from the PLL VCO. The method further includes a step (c) filtering the phase bias signal and summing the filtered phase bias signal with a bias signal from the FLL loop for generating a PLL VCO input voltage for adjusting the PLL frequency wherein the PLL VCO input voltage is only used for fine tuning the PLL VCO within the frequency band for minimizing the frequency bias and the phase bias and for locking to the input phase. More specifically, the step of generating a delimited bias voltage capable of coarse tuning the voltage of the FLL VCO in step (a) further includes a step of generating a bias voltage as that shown in FIG. 5A which will be described below. And, the step of generating a PLL VCO input voltage for adjusting the PLL frequency in step (b) further includes a step of generating a PLL VCO input voltage as that shown in FIG. 5B which will also be described below.

Figure 4:
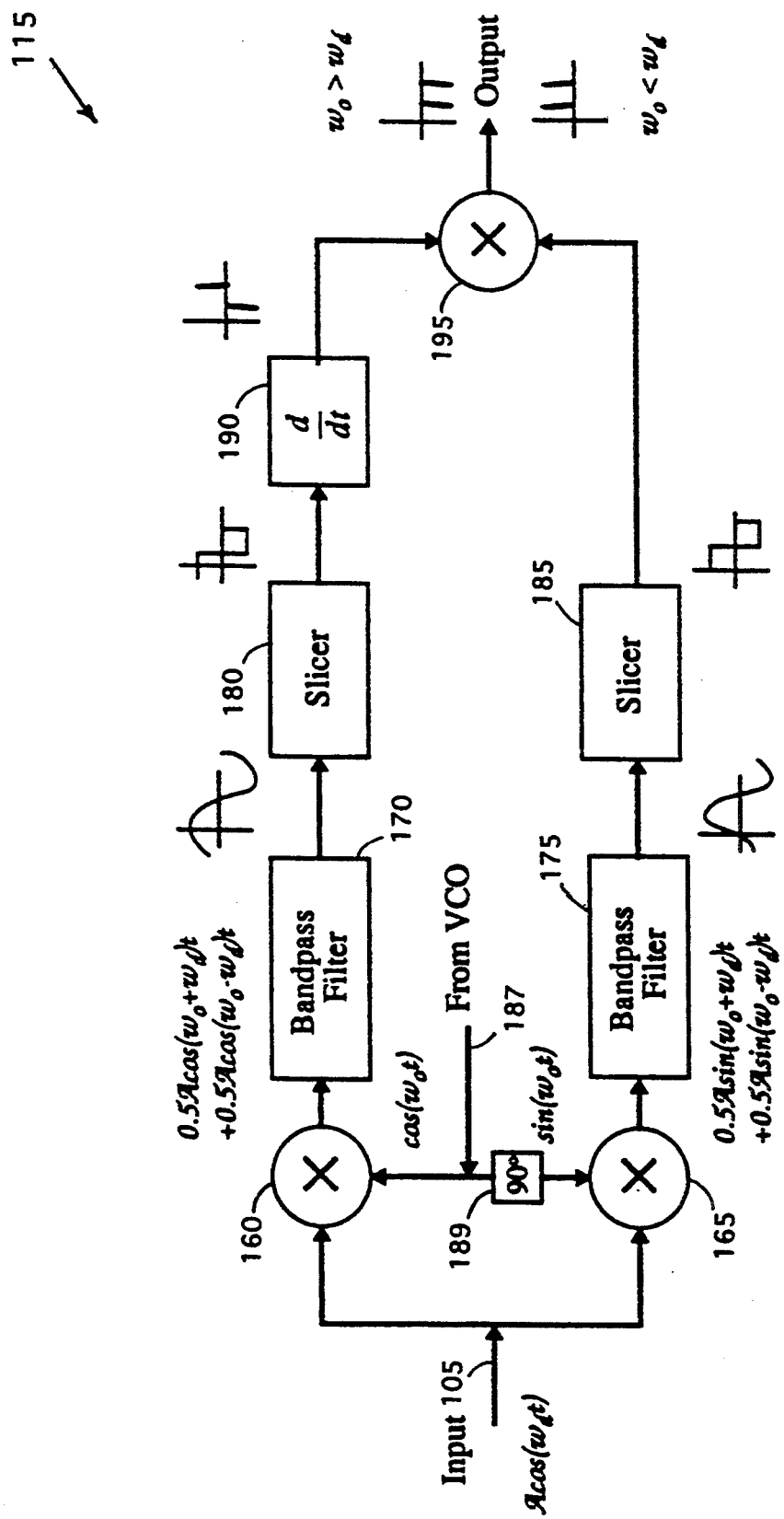
FIG. 4 is a block diagram showing the functional processes of a frequency delimiter implemented in the time recovery system of FIG. 3 of the present invention.

FIG. 4 shows the detail structure of the frequency delimiter 115. The input signal from the input line 105 where the input signal is represented as a wave function Acos(foit) with an amplitude A and frequency $\omega i$. The frequency delimiter 115 also receives a signal on line 187 from the VCO 130 which is represented by a wave function COS ($\omega o t$) where the frequency is $\omega o$. The input signal Acos($\omega i t$) is first processed by two multipliers, i.e., multiplier 160 and 165, wherein the input signal is multiplied by the signal received from the VCO 130 on multiplier 160. The signal received from the VCO 130 is also ninety-degree phase shifted by a phase shifter 189 and on multiplier 165 the input signal is multiplied by the ninety-degree shifted signal. The output function generated from the multiplier 160 is:

$$0.5\ A\ COS\ (\omega_o+\omega_i)\ t + 0.5\ A\ COS\ (\omega_o-\omega_i)\ t \quad (1)$$

and the output function generated from the multiplier 165 is:

$$0.5\ A\ SIN\ (\omega_o+\omega_i)\ t + 0.5\ A\ SIN\ (\omega_o-\omega_i)\ t \quad (2)$$

Each of these output functions as represented by Equations (1) and (2) are then processed by two bandpass filters 170 and 175 respectively. Each of these bandpass filters is a combination of a low-pass filter and a high-pass filter wherein the component for the sum of these two frequencies, i.e., $\omega_o+\omega_i$, is filtered out by the high and low pass filters and the component for the difference of these two frequencies, i.e., $\omega_o-\omega_i$, is filtered through to be further processed for generating the output of the delimiter. These signals as represented by Equations (1) and (2) after being filtered by the bandpass filters 170 and 175 representing the component for frequency difference $\omega_o-\omega_i$, are then converted to two square functions by slicers 180 and 185 respectively wherein there is a ninety degree phase difference between these two square functions. The output square wave function generated from the slicer 180 is then processed by a differentiator 190 to generate a function which has a negative delta function with a value of $-0.5$ at phase angle 0° and a positive delta function with a value of $+0.5$ at a phase angle 90°. The output signal from the differentiator 190 is then multiplied with the output function from the slicer 185 by the multiplier 195 which generates two types of output functions. When the angular speed of the input signal is greater than the angular speed of the VCO 130, i.e., $\omega_i > \omega_o$, then two pulses with a positive value of 0.5 are generated. Conversely, when $\omega_i > \omega_o$, then two pulses with a negative value of 0.5 are generated. The greater the frequency bias, the closer in time that these two pulses are generated. The output signals as represented by a sequence of pulses over time reflecting the input signal and VCO 130 output signal frequency difference is thus generated by the frequency delimiter 115 via the multiplier 195 which is then used by the loop filter 135 to generate an output of the FLL loop 110 to the PLL loop 120 and for feedback to the VCO 130 (FIG. 3).

A frequency delimiter 115 (FIG. 4) is disclosed in the present invention which comprises a first branch which includes a first multiplication means 160 for receiving the input signals, a first bandpass filter 170, a first slicer 180, and a differentiator 190 connected in sequence. The frequency delimiter further includes a second branch which includes a second multiplication means 165 for receiving the input signals, a second bandpass filter 175, and a second slicer 185 connected in sequence. The frequency delimiter 115 further includes a VCO input port 187 for receiving the FLL VCO reference frequency. The VCO input port 187 is connected to the first multiplication means 160 for inputting the FLL VCO signal thereto and for multiplying the FLL VCO reference signal to the input signal thereon for generating a first synthesized signal. The VCO input port 187 further is connected to the second multiplication means 165 via a ninety-degree-shifter 189 for inputting a ninety-degree-shifted VCO reference signal thereto and for multiplying the ninety-degree shifted signal to the input signal thereon for generating a second synthesized signal. The first and second bandpass filters 170 and 175 respectively further filter out the first and second synthesized signals with frequency higher or lower than a predefined frequency band for generating a first and a second bandpassed synthesized signals. The first and the second slicer 180 and 185 respectively process the first and second bandpassed synthesized signals respectively for generating a first and a second bandpassed square wave functions. The differentiator 190 differentiates the first bandpassed square wave function into bandpassed positive and negative pulses. The frequency delimiter 115 further includes an output multiplication means 195 which is connected to the differentiator 190 and the second slicer 185 for receiving and multiplying the bandpassed positive and negative pulses and the bandpassed square wave function for generating the delimited bias signal.

Figure 5:
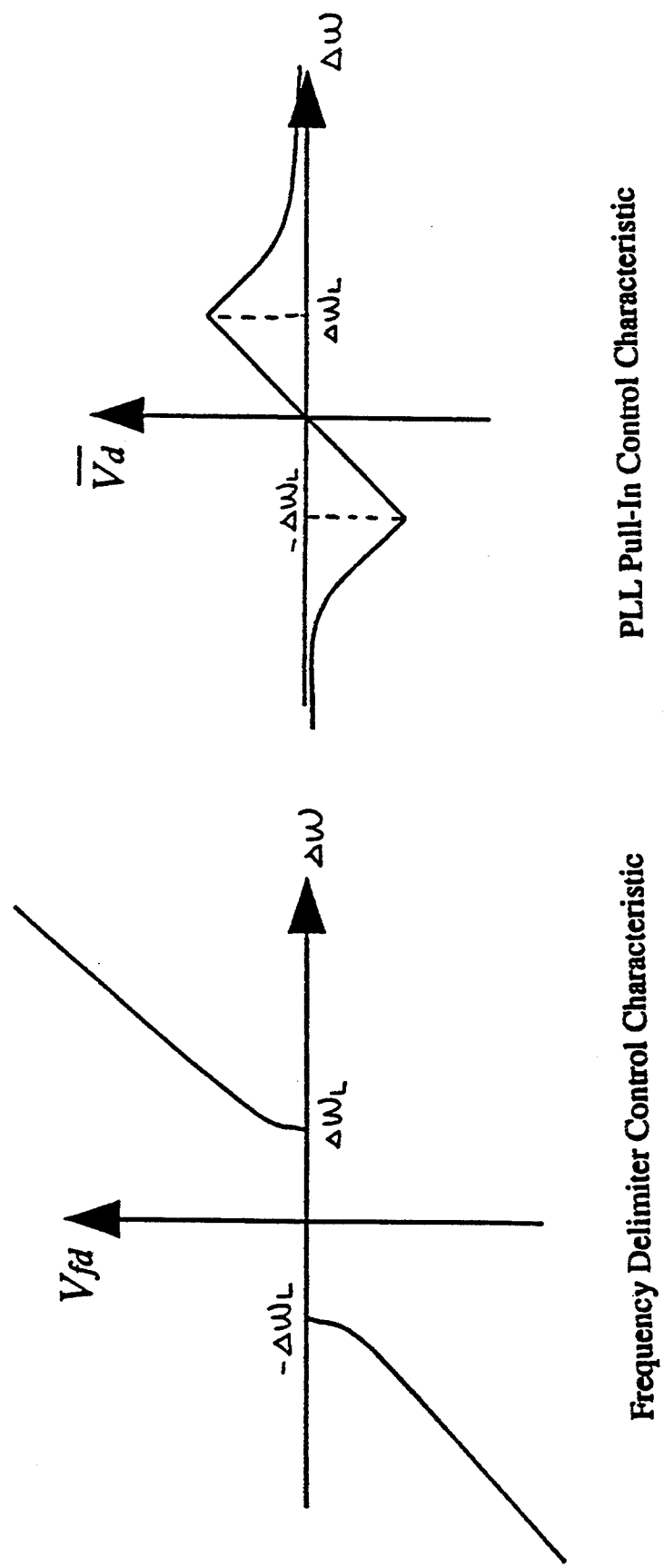
FIG. 5 shows the control characteristics of the frequency delimiter and the PLL pull-in signals.

FIG. 5A shows the control characteristics of the frequency delimiter 115 for the FLL VCO 130 wherein the output voltage $V_{fd}$ to the FLL VCO 130 is a function of the frequency deviation $\Delta\omega=\omega_o-\omega_i$ which in turn is a function of the rate of pulses generated at the output port from the multiplication 195 of the delimiter 115. By the use of the FLL loop filter filter 135, the voltage $V_{fd}$ for controlling the voltage of FLL VCO 130 in response to the output of the frequency delimiter 115 has the characteristics that when the frequency bias is within the frequency band, i.e., $(\omega_o-\omega_i)<\Delta\omega_L$ or $(\omega_o-\omega_i)>\Delta\omega_L$, there are no pulses generated by the delimiter 115 and the output is identically zero. When the input and output frequency bias is outside the range of the frequency band, the input voltage to the FLL is increased rapidly with increased frequency bias such that a very effective frequency trimming can be achieved. FIG. 5B shows the control characteristics of the PLL pull-in voltage $V_d$ for the PLL VCO 145. There is small voltage with linear variation over the range between $\Delta\omega_L$ and $\Delta-\omega_L$ and negligible voltage input to the PLL VCO outside of the frequency band. Therefore, by the use of the frequency delimiter 115 and the loop filter 135, the operation of the phase loop, i.e., PLL 120, is entirely independent from FLL 110. The frequency loop FLL 110 is used to perform the coarse tuning to lock the frequency. Once the frequency is within the range of the bandpass upper and lower limits, i.e. $\omega_L$ and $-\omega_L$, then the phase loop PLL takes over to fine tune and lock in the phase to complete the time synthesis tasks for the receiving system.

The difficulties of the prior art time recovery systems caused by the interferences between the FLL and PLL are therefore resolved. The speed of time acquisition for the signal receiving system is improved because of the elimination of the inter-loop interferences. Additionally, the time synthesis system 100 has the advantages that the FLL can perform continuous and automatic frequency trimming without requiring an external reference clock. The cost of manufacturing is reduced because better IC integration can now be achieved with the simpler circuit architecture and reduced hardware requirement. The time recovery system as taught by the present invention also provides a system designer greater degree of flexibility. A designer is allowed to flexibly customize the frequency detecting range by adjusting the characteristics of the bandpass filter limits of the loop filter 135.

Figure 6:
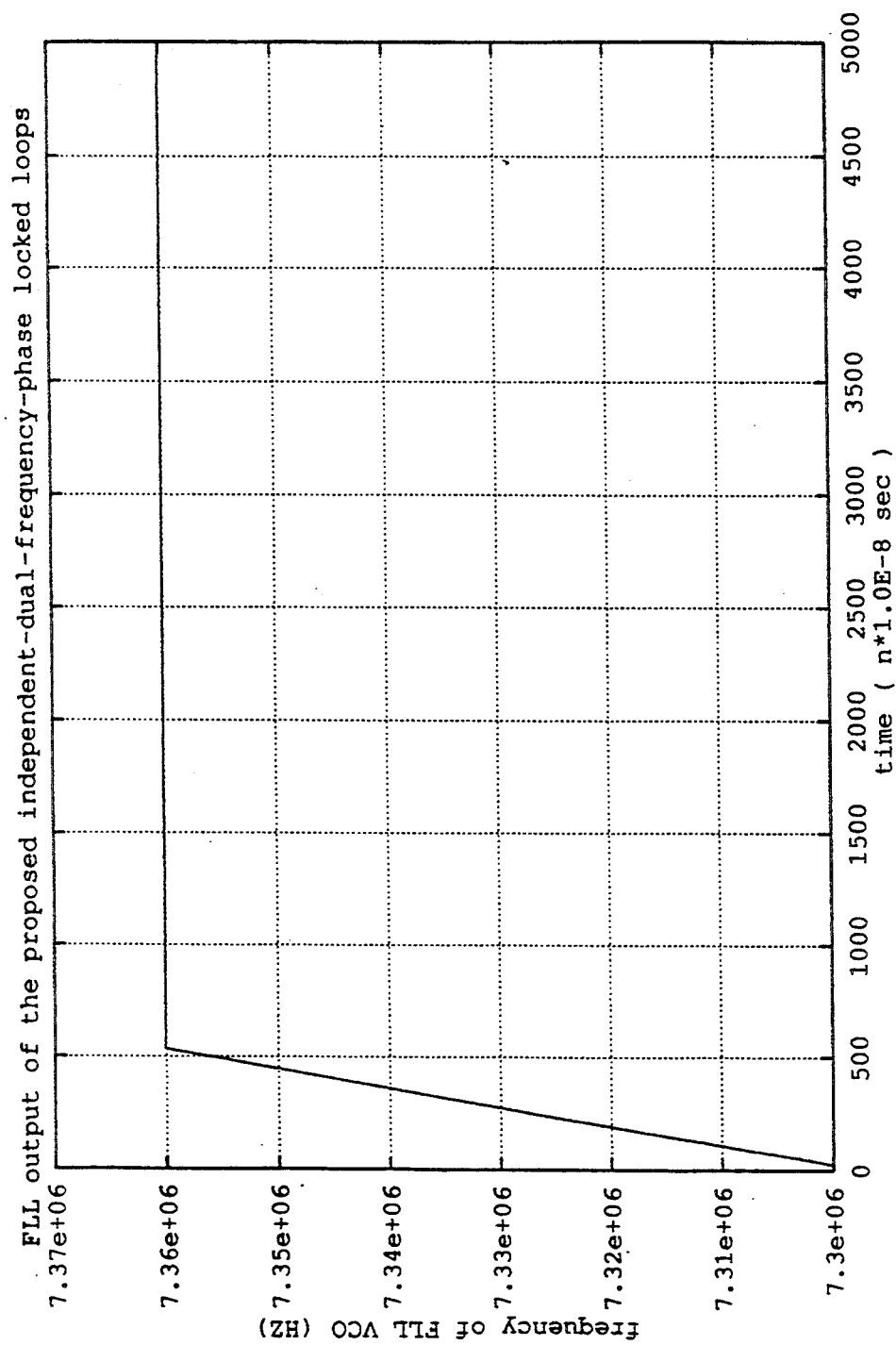
FIG. 6 shows the frequency of FLL VCO as a function of time during the process of time-synthesis performed by the time recovery system of FIG. 3.

FIG. 6 is a typical transient behavior of a FLL loop 110. Because of the operation of the frequency delimiter 115, the operation of the FLL 110 is not interfered with by the phase loop 120. The output of the FLL 110 is able to reach a stable value rapidly, e.g., in less than 6 micro-seconds, i.e., $6\times10^{-6}$ second. The speed of the entire time acquisition process is thus greatly improved by the use of the independent dual loop system 100 of the present invention.

A method for synchronizing a system to the frequency and phase of a plurality of input signals is also disclosed in this invention. The method comprises the steps of (a) utilizing a frequency lock loop (FLL) including a FLL VCO and a delimited frequency generating means wherein the delimited frequency bias generating means receiving a FLL VCO frequency and the frequency of the input signals for generating a delimited bias voltage capable of coarse tuning the voltage of the FLL VCO when the difference between the input frequency and the FLL VCO frequency is outside of a predetermined frequency band and the delimited bias voltage reducing to zero when the frequency difference is within the frequency band; (b) utilizing a phase lock loop (PLL) including a PLL VCO for generating a PLL loop frequency, and phase detector for receiving and detecting the phase of the input signal and for generating a phase bias signal utilizing the PLL loop frequency from the PLL VCO; and (c) filtering the phase bias signal and summing the filtered phase bias signal with a bias signal from the FLL loop for generating a PLL VCO input voltage for adjusting the PLL frequency wherein the PLL VCO input voltage is only used for fine tuning the PLL VCO within the frequency band for minimizing the frequency bias and the phase bias and for locking to the input phase. In a specific preferred embodiment, the method for synchronizing a system to the frequency and phase of a plurality of input signals for the step of generating a delimited bias voltage capable of coarse tuning the voltage of the FLL VCO in step (a) further includes a step of generating a bias voltage as that shown in FIG. 5A. And, the step of generating a PLL VCO input voltage for adjusting the PLL frequency in step (b) further includes a step of generating a PLL VCO input voltage as that shown in FIG. 5B.

Figure 7:
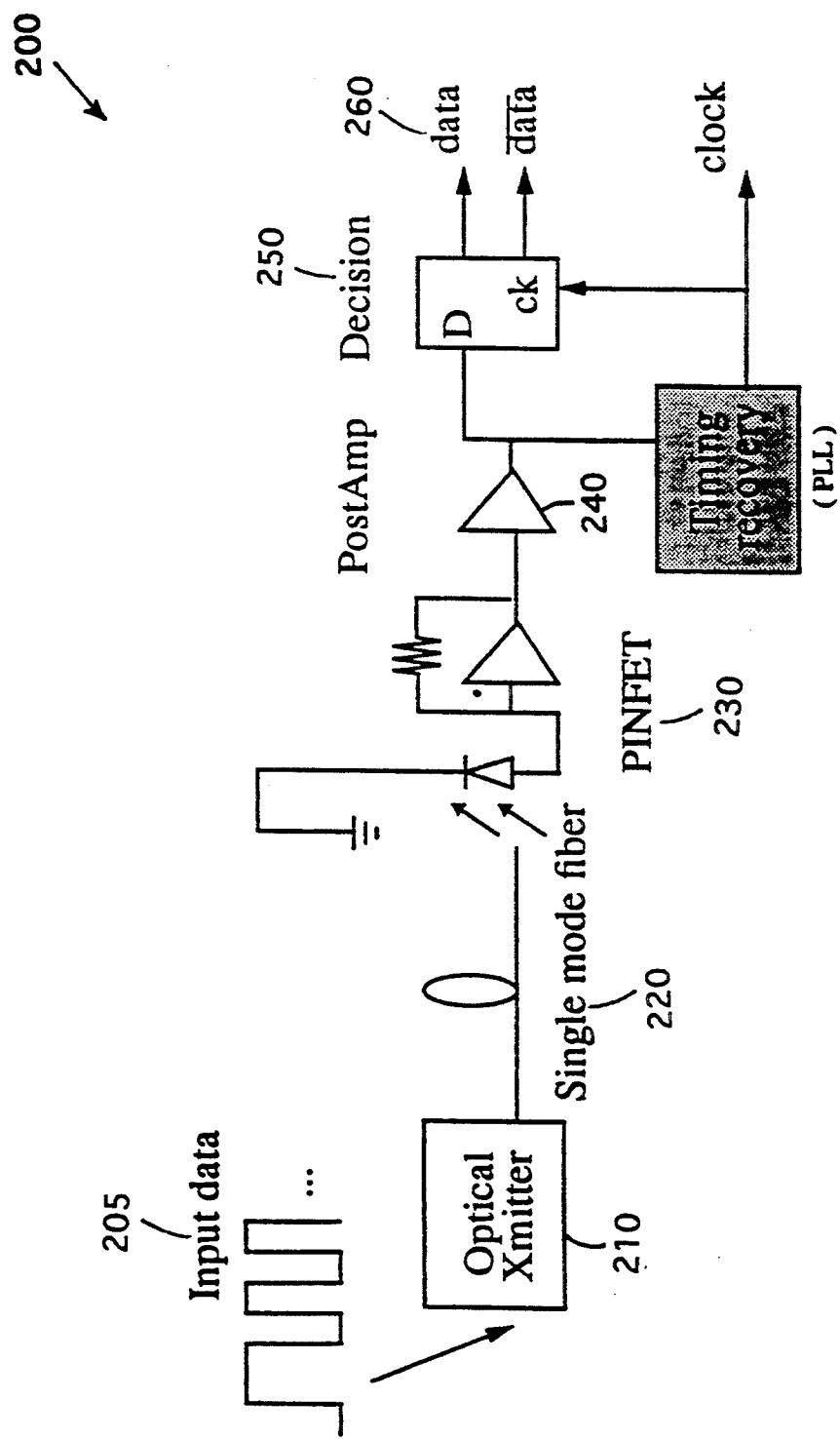
FIG. 7 is a block diagram showing a system configuration of a digital optical data link and processing system utilizing the time recovery system of the present invention.

FIG. 7 shows a typical digital data processing system 200 utilizing optical data link which has to be operated at very high speed. The input data 205 are first converted to a sequence of optical signals to be transmitted by an optical transmitter 210. The optical signals are then transmitted from the transmitter 210 via a single mode fiber 220 to a p-intrinsic-n field effect transistor (PEFET) 230 for generating a sequence of corresponding electronic signals. These signals are amplified by a pre-amplifier 240 which are then received by a decision circuit 250 for generating appropriate output signals 260. However, the frequency and the phase of the output data must be identified with the input signals 205 such that the output signals may be accurately received and processed. A time recovery system 270 such as that disclosed by the present invention is used to generate the reference dock signal which is properly synthesized with the frequency and phase of the input signals 205 such that the output signals generated may be accurately utilized.

Figure 8:
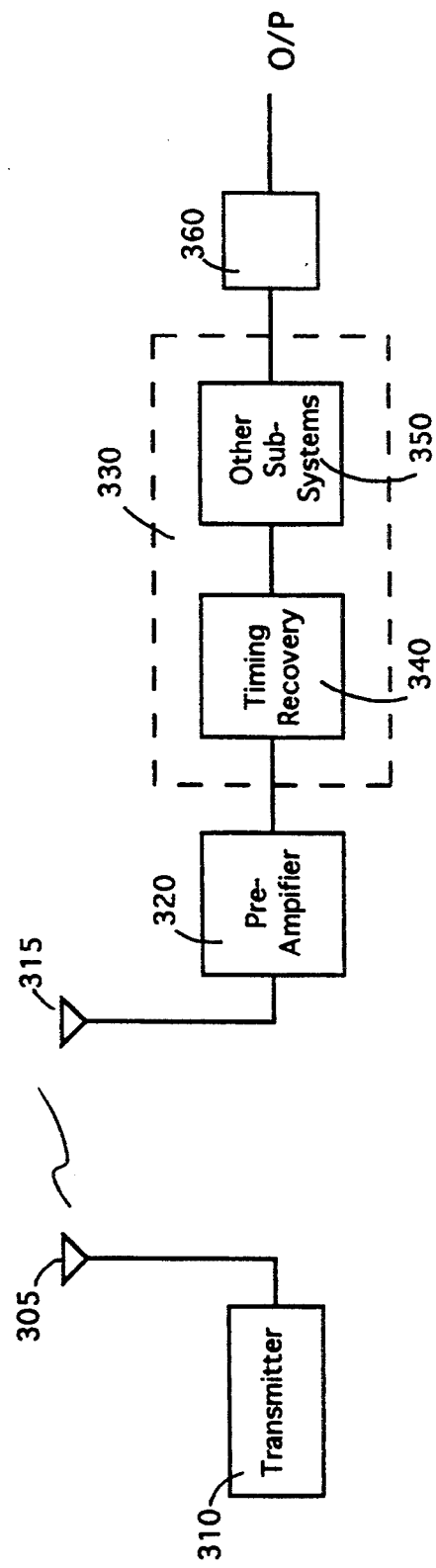
FIG. 8 is a block diagram showing a system configuration of a personal communication system utilizing the time recovery system of the present invention.

The digital signal processing system 200 which uses optical data link for data transmission is only one among many modern data handling and electronic data communication and processing system where the time recovery system as taught by the present invention may be used. Other applicable systems are high speed facsimile machine, satellite data transmission and reception systems, and wideband personal communication system (PCS). A standard PCS system 300 is shown in FIG. 8 wherein the time recovery system as disclosed in this invention can be utilized. The personal communication system 300 typically includes a signal transmitter 310 which transmits high frequency electromagnetic waves from a transmitter antenna 305 to a receiver antenna 315. The received signal is amplified by a preamplifier 320 then received by a signal processing system 330. The signal processing system 330 includes a time recovery device 340 as disclosed in the present invention to properly synchronize the signal processing system 330 with the received signal before further processes are carried out by personal communication signal processing subsystems 350 before the processed signal is outputted from a user interface subsystem 360 as the final output for the receiver user.

The time recovery system as disclosed in this invention can be employed in any receiver for receiving and processing a plurality of input signals with an input frequency and an input phase. The receiver typically includes an input signal receiving and processing means, e.g., the receiver antenna 315 and the preamplifier 320 (FIG. 8), for receiving and processing the input signals. It also includes a time acquisition system 340 as disclosed in the present invention. The receiver further includes an output means, e.g., the signal processing sub-system 350 and the user interface subsystem 360, for processing the processed input data utilizing the synchronized frequency and phase generated by the FLL and PLL loops as disclosed in the present invention for generating output signals for the receiver.

The acquisition achievable for the data processing system with optical link 200 (FIG. 7), the personal communication system 300 (FIG. 8) and other systems for various data or signal communication are improved by utilizing a time recovery system disclosed in this invention. The interferences between the frequency and phase loops which prevent the prior art time synthesis apparatuses to quickly lock to the input frequency and phase are eliminated. With the frequency loop and the phase loop operating independently from one another, the parameters for the devices used in each loop can be easily optimized to further improve the stability and the speed of time recovery. The requirement of external frequency reference such as a reference clock is removed. The time recovery system of the present invention can be conveniently integrated into an integrated (IC) chip. The major difficulties of the prior art are therefore resolved by the time recovery system as taught by this invention.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A time acquisition system comprising:
    a frequency lock loop (FLL) for receiving an input signal with an input frequency and phase, and for outputting a frequency bias signal when a difference frequency between said input signal and said FLL is outside a predetermined frequency band,
    a phase lock loop (PLL) for receiving said input signal, and for outputting a phase bias signal when said difference frequency is inside said predetermined frequency band, and
    a summing circuit for receiving said frequency bias signal from said FLL, and for receiving said phase bias signal from said PLL, and for outputting a bias input signal, wherein
    said bias input signal comprises said frequency bias signal from said FLL only when said difference frequency between said input signal and said FLL is outside said predetermined frequency band, and wherein
    said bias input signal comprises only said phase bias signal from said PLL when said difference frequency between said input signal and said FLL is inside said predetermined frequency band.

2. The time acquisition system of claim 1 wherein interference between said FLL and said PLL is eliminated whenever said difference frequency is inside said predetermined frequency band.

3. The time acquisition system of claim 1 wherein said FLL comprises:
    a frequency delimiter for receiving said input signal and for outputting a non-zero delimited frequency bias signal when said difference frequency is outside said predetermined frequency band, and for outputting a zero delimited frequency bias signal when said difference frequency is inside said predetermined frequency band,
    an FLL loop filter for receiving said delimited frequency bias signal and for outputting said frequency bias signal,
    an FLL voltage controlled oscillator (VCO) for receiving said frequency bias signal and for outputting a frequency reference signal to said frequency delimiter.

4. The frequency delimiter of claim 3 wherein said frequency delimiter comprises:
    a first branch, comprising:
        a first multiplier for receiving said input signal and said frequency reference signal, and for outputting a first synthesized signal,
        a first bandpass filter for receiving said first synthesized signal and for outputting a first bandpassed signal,
        a first slicer for receiving said first bandpassed signal and for outputting a first square wave function, and.
        a differentiator for receiving said first square wave function and for outputting positive and negative signals;
    a second branch, comprising:
        a second multiplier for receiving said input signal and said frequency reference signal, shifted 90 degrees in phase, and for outputting a second synthesized signal,
        a second bandpass filter for receiving said second synthesized signal and for outputting a second bandpassed signal, and
        a second slicer for receiving said second bandpassed signal and for outputting a second square wave function; and
    a third multiplier for receiving said positive and negative signals from said differentiator, and for receiving said second square wave function from said second slicer, and for outputting said delimited frequency bias signal.

5. The time acquisition system of claim 1 wherein said PLL comprises:
    a phase detector for receiving said input signal and said phase reference signal, and for outputting a phase signal,
    a PLL loop filter for receiving said phase signal and for outputting said phase bias signal to said summing circuit, and
    a PLL VCO for receiving said bias input signal from said summing circuit and for outputting said phase reference signal to said phase detector.

6. A method for synchronizing a system to the frequency and phase of an input signal comprising the steps of:
   (a) generating a non-zero frequency bias signal in a frequency lock loop (FLL) only when a difference frequency between said FLL and said input signal is outside a predetermined frequency band,
   (b) generating a zero frequency bias signal when said difference frequency is inside said predetermined frequency band,
   (c) generating a phase bias signal in a phase lock loop (PLL) when said difference frequency is inside said predetermined frequency band, and
   (d) summing said frequency bias signal and said phase bias signal to produce a bias input signal.

7. A receiver for receiving and processing a transmitted signal with an input frequency and an input phase, comprising:
   a frequency lock loop (FLL) for receiving said transmitted signal and for outputting a non-zero frequency bias signal only when a difference frequency between said processed signal and said FLL is outside a predetermined frequency band,
   a phase lock loop (PLL) for receiving said transmitted signal and for outputting a phase bias signal when said difference frequency is inside said predetermined frequency band,
   a summing circuit for receiving said frequency bias signal and said phase bias signal and for outputting a bias input signal, and
   a PLL voltage controlled oscillator (VCO) for receiving said bias input signal and for outputting a reference clock signal.

8. The receiver of claim 7 wherein interference between said FLL loop and said PLL loop is eliminated when said frequency difference is inside said predetermined frequency band.

9. The receiver of claim 8 wherein said transmitted signal is an optical signal and wherein said receiver further comprises a p-intrinsic-n field effect transistor (PINFET) for receiving said optical signal and for generating an electrical signal in response thereto.

10. The receiver of claim 7 wherein said reference clock signal is synchronized with said input frequency and said input phase of said input signal.

11. The receiver of claim 10 further comprising a decision circuit and a clock circuit for receiving said reference clock signal and for synthesizing an output signal synchronized to said transmitted signal.

12. A personal communication system comprising:
   a signal transmitter for transmitting a signal,
   a receiver for receiving said transmitted signal, and for outputting a pre-amplified signal, said receiver comprising:
      a frequency lock loop (FLL) for receiving said pre-amplified signal and for outputting a frequency bias signal only when a difference frequency between said pre-amplified signal and said FLL is outside a predetermined frequency band,
      a phase lock loop (PLL) for receiving said pre-amplified signal and for outputting a phase bias signal when said difference frequency is inside said predetermined frequency band,
      a summing circuit for receiving said frequency bias signal and said phase bias signal and for outputting a bias input signal, and
      a PLL voltage controlled oscillator (VCO) for receiving said bias input signal and for outputting said synchronized signal.

13. The receiver of claim 12 wherein inter-loop interference is eliminated between said FLL loop and said PLL loop when said frequency difference is inside said predetermined frequency band.

14. A time acquisition system comprising:
   a frequency lock loop (FLL) for receiving an inputted signal having an inputted frequency and phase and outputting a frequency bias signal only when a difference signal between said inputted frequency and said FLL is outside of a predetermined range $-\Delta\omega_L$ to $\Delta\omega_L$,
   a phase lock loop for receiving said inputted signal and for outputting a phase bias signal when said difference signal is within said predetermined range $-\Delta\omega_L$ to $\Delta\omega_L$, and
   a summation circuit for adding said first and second output signals to produce a voltage controlled oscillator bias signal.

15. The time acquisition of claim 14 wherein said phase lock loop is synchronized in frequency and phase to said inputted signal by fine tuning said phase lock loop with said voltage controlled oscillator bias signal.

* * * * *